(12) United States Patent
Huang

(10) Patent No.: US 10,453,907 B2
(45) Date of Patent: Oct. 22, 2019

(54) OLED DEVICE AND METHOD FOR FABRICATING THE SAME

(71) Applicant: WUHAN CHINA STAR OPTOELECTRONICS SEMICONDUCTOR DISPLAY TECHNOLOGY CO., LTD., Wuhan (CN)

(72) Inventor: Jing Huang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/041,844

(22) Filed: Jul. 23, 2018

(65) Prior Publication Data

US 2019/0058025 A1 Feb. 21, 2019

Related U.S. Application Data

(63) Continuation of application No. PCT/CN2018/087201, filed on May 17, 2018.

(30) Foreign Application Priority Data

Aug. 21, 2017 (CN) .......................... 2017 1 0722980
Mar. 30, 2018 (CN) .......................... 2018 1 0297153

(51) Int. Cl.
*H01L 27/32* (2006.01)
*H01L 51/56* (2006.01)
*H01L 51/52* (2006.01)
*H01L 51/00* (2006.01)

(52) U.S. Cl.
CPC ...... *H01L 27/3258* (2013.01); *H01L 51/0005* (2013.01); *H01L 51/5253* (2013.01); *H01L 51/56* (2013.01)

(58) Field of Classification Search
None
See application file for complete search history.

(56) References Cited

U.S. PATENT DOCUMENTS

| 8,492,974 | B2 | 7/2013 | Lee |
| 9,105,867 | B2 | 8/2015 | Verschuuren |
| 2008/0317943 | A1 | 12/2008 | Hirai |

(Continued)

FOREIGN PATENT DOCUMENTS

| CN | 104425721 A | 3/2015 |
| CN | 106057857 A | 10/2016 |

(Continued)

*Primary Examiner* — Alexander G Ghyka

(57) ABSTRACT

The present disclosure relates to an OLED device and a method for preparing the same. The method includes: providing an OLED basic device; forming a hydrophobic layer selectively covering a light emitting side surface of the OLED basic device by an ink jet printing method; forming an optical coupling efficiency enhancing layer on an area of the light emitting side surface in a selective atom precipitation way, which may not be covered by the hydrophobic layer. The optical coupling efficiency enhancing layer is formed between adjacent hydrophobic layers to form a periodic distribution array, thereby improving the optical coupling efficiency of the OLED device.

18 Claims, 3 Drawing Sheets

(56) References Cited

U.S. PATENT DOCUMENTS

| | | | |
|---|---|---|---|
| 2013/0182418 A1 | 7/2013 | Sawabe et al. | |
| 2013/0285026 A1* | 10/2013 | Miskiewicz | H01L 51/0034 257/40 |
| 2015/0009432 A1 | 1/2015 | Katagiri | |
| 2015/0270485 A1* | 9/2015 | Watanabe | H01L 51/0007 257/40 |
| 2016/0064689 A1* | 3/2016 | Xie | H01L 51/5256 438/26 |
| 2017/0141353 A1* | 5/2017 | Vronsky | H01L 51/0005 |
| 2018/0061719 A1* | 3/2018 | Vronsky | H01L 51/0005 |
| 2019/0092623 A1* | 3/2019 | Ding | H01L 27/3227 |
| 2019/0148468 A1* | 5/2019 | Jia | H01L 27/3246 257/40 |
| 2019/0214604 A1* | 7/2019 | Zhen | H01L 51/0003 |

FOREIGN PATENT DOCUMENTS

| | | |
|---|---|---|
| CN | 106784365A A | 5/2017 |
| CN | 106784402 A | 5/2017 |
| CN | 107528010A A | 12/2017 |
| KR | 20130073184 A | 7/2013 |

\* cited by examiner

OLED DEVICE AND METHOD FOR FABRICATING THE SAME

CROSS-REFERENCE TO RELATED APPLICATIONS

The present application is a continuation-application of International (PCT) Patent Application No. PCT/CN2018/087201 filed on May 17, 2018, which claims foreign priority of Chinese Patent Application No. 201710722980.X filed on Aug. 21, 2017 and No. 201810297153.5 filed on Mar. 30, 2018 in the State Intellectual Property Office of China, the entire contents of which are hereby incorporated by reference.

TECHNICAL FIELD

The disclosure relates to an OLED display technical field, and more particularly to a method for fabricating an OLED device.

BACKGROUND

The OLED (Organic Light Emitting Diode) devices have advantages of self-illumination, wide viewing angle, high speed response, high contrast ratio, ultra-thinness, and flexible folding. However, there is only 20% of the total light generated by OLED structures can illuminate out of the OELD device. How to improve the optical coupling output efficiency of OLEDs through simple processes is essential for the industrialization of OLED technology. For this reason, people use the periodical distribution array on the light-emitting surface of the OLED device, and utilize the scattering and refraction characteristics with the periodic distribution array to improve the optical coupling efficiency of the OLED device.

There are generally two methods for preparing a periodic distribution array on the light-emitting surface of the OLED device. One is the use of chemical methods, combined with photoresist, and then exposure and development to form the above-mentioned periodic array. But, this method requires the repeated use of a chemical solution, which tends to corrode other structures of the OLED device. The other method is to prepare the above-mentioned periodical distribution array by filming with a metal mask, but this method is very costly, and the metal mask is difficult to clean after use, and becomes thicker afterwards, resulting in uneven film formation and poor optical coupling efficiency of the OLED device.

SUMMARY

The technical problem mainly solved by the present disclosure is to provide a method for fabricating an OLED device, which can avoid the chemical corrosion and reducing the production cost after completing the fabricating of the periodic distribution array on the OLED device, and improve the optical coupling efficiency.

To address the technical problems above, a technical solution adopted by the present disclosure is to provide a method for preparing an OLED device. The method in the present disclosure may conclude: providing an OLED basic device; forming a hydrophobic layer selectively covering a light emitting side surface of the OLED basic device by an ink jet printing method; forming an optical coupling efficiency enhancing layer on an area of the light emitting side surface in a selective atom precipitation way, which may not be covered by the hydrophobic layer.

To address the technical problems above, a technical solution adopted by the present disclosure is to provide an OLED device fabricated by the method above. The OELD device in the present disclosure may conclude: a basic OLED device; a first water-oxygen barrier layer; a first stress release layer; a second water-oxygen barrier layer; an optical coupling efficiency enhancing layer; at least one of a third water-oxygen barrier layer and a second stress release layer, which are successively disposed on the basic OLED device.

The present disclosure may have the following advantages: different from the situation of the prior art, the present disclosure provides an OLED device and a method for fabricating the same, and the method may conclude: forming a hydrophobic layer selectively covering a light emitting side surface of the OLED basic device by ink jet printing, and then forming an optical coupling efficiency enhancing layer on an area of the light emitting side surface in a selective atom precipitation way, which may not be covered by the hydrophobic layer. Since the hydrophobic layer has an inhibitory effect on the film growing in a selective atom precipitation way, the optical coupling efficiency enhancing layer may be not formed on the hydrophobic layer. The optical coupling efficiency enhancement layer may be formed between adjacent hydrophobic layers to form a periodic distribution array, thereby improving the optical coupling efficiency of the OLED device. At the same time, the ink jet printing method and the selective atom precipitation method used in the above preparation method are the method used in fabricating other functional layers of the OLDE device, which may have a simple manufacturing process and a low cost. The method in the present disclosure may do not require the use of chemical reagents, and do not damage the OLED device.

BRIEF DESCRIPTION OF THE DRAWINGS

In order to make the technical solution of embodiments of the present disclosure more clearly, drawings used for the description of the embodiments will be briefly described. Apparently, the drawings described above are only some exemplary embodiments of the present disclosure. One skilled in the art may acquire other drawings based on these drawings without any inventive work. In the drawings.

DETAILED DESCRIPTION

The technical solution of the embodiments of the present disclosure will be described more clearly and completely with reference to the accompanying drawings. Apparently, the embodiments described here only some exemplary embodiments, not all the embodiments. Based on the embodiments described in the present disclosure, one skilled in the art may acquire all other embodiments without any creative work. All these shall be covered within the protection scope of the present disclosure.

Figure 1:
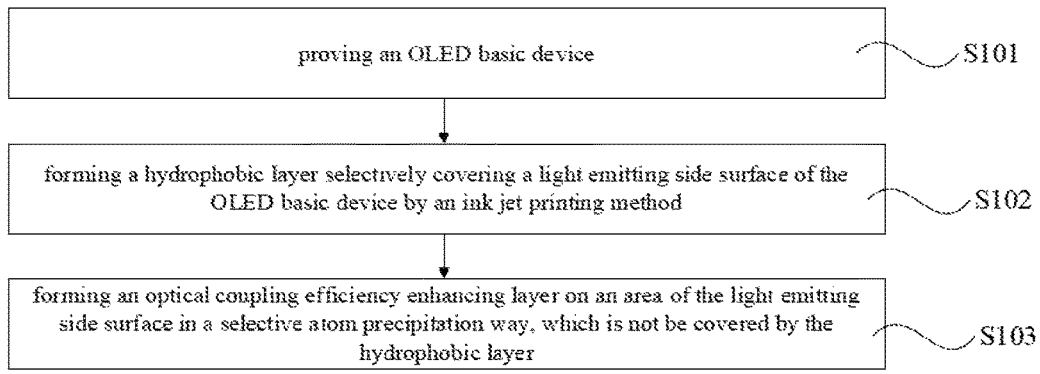
FIG. 1 is a flowchart of a method for fabricating an OLED display device according to an embodiment of the disclosure.
Figure 2:
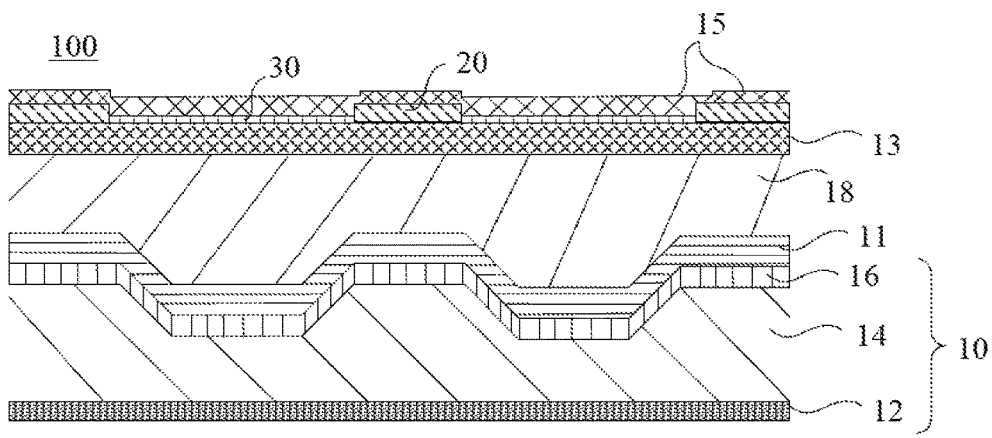
FIG. 2 is a structural schematic view of an OLED device according to an embodiment of the present disclosure.

Referring to FIG. 1 and FIG. 2, FIG. 1 is a flowchart of a method for fabricating an OLED display device according to an embodiment of the disclosure, and FIG. 2 is a structural schematic view of an OLED device 100 according to an embodiment of the present disclosure. In FIG. 2, an OLED device 100 provided in the embodiment of the disclosure may include: a basic OLED device 10; a first water-oxygen barrier layer 11; a first stress release layer 18; a second water-oxygen barrier layer 13; an optical coupling efficiency enhancing layer 30; at least one of a third water-oxygen barrier layer 15 and a second stress release layer (no shown), which are successively disposed on the basic OLED device 100.

A method for fabricating an OLED device 100 may be provided according to an embodiment of the present disclosure. The method may include the following blocks.

S101: providing an OLED basic device 10.

The OLED base device 10 may include at least a base layer 12, a TFT 14 (Thin Film Transistor) formed on the base layer 12, an OLED 16 on the TFT 14. The TFT 14 and the OLED 16 may constitute a light emitting unit, which may emit light at the direction away from the base layer 12.

S102: forming a hydrophobic layer 20 selectively covering a light emitting side surface of the OLED basic device 10 by an ink jet printing method.

The OLED base device 10 may be moved into an ink jet printing chamber, and the above-mentioned light-emitting side surface may be subjected to a hydrophobic treatment by an ink jet printing method, which may be aimed to form a plurality of hydrophobic layers 20 on the light emitting side surface of the OLED base device 10. The hydrophobic layer 20 may be made of a polymer material such as polytetrafluoroethylene (PTFE) and ferroferric oxide nanomaterials. In other embodiments, the material for forming the hydrophobic layer 20 may also be other materials having a hydrophobic function, such as single crystal silicon. In an example, the hydrophobic layer 20 may have a thickness of 1-2 μm.

As shown in FIG. 2, other film structures 11, 13, and 18 may also be formed on the surface of the OLED 16 before block S102. Specifically, other film layers are mainly TFE (Thin Film Encapsulation). The above film structures will be described in detail below. Of course, as understood by those skilled in the art, the above-mentioned film layer structure may also be omitted or changed according to actual conditions.

S103: forming an optical coupling efficiency enhancing layer 30 on an area of the light emitting side surface in a selective atom precipitation way, which may not be covered by the hydrophobic layer 20.

The OLED base device 10 after block S102 may be moved to a selective atom deposition chamber, and an optical coupling efficiency enhancing layer 30 may be formed on the surface of the light emitting side that has not been hydrophobized, which may not be covered by the hydrophobic layer 20. Specifically, the material for fabricating the light coupling rate enhancing layer 30 may include at least one of high refractive index metal oxides such as ZnO, TiO2, and ZrO2.

The refractive index of the light coupling efficiency enhancing layer 30 is at least equal to or greater than 1.5, thereby improving the optical coupling efficiency of the OLED device 100. In an example, the thickness of the optical coupling ratio enhancing layer 30 may be less than that of the hydrophobic layer 20, which can ensure that the edges of the optical coupling rate enhancing layer 30 contacted with the hydrophobic layer 20 may do not overflow during the fabricating process. In other embodiments, the thickness of the light coupling enhancement layer 30 may also be greater than that of the hydrophobic layer 20. In some embodiments, the thickness of the optical coupling efficiency enhancing layer 30 may be 10-60 nm.

Specifically, the above-mentioned interval setting optical coupling efficiency enhancement layer 30 and hydrophobic layer 20 may be formed on TFE, or formed between any two layers of TFE.

In block S103, the hydrophobic layer 20 may be used to inhibit the growth of the thin film grown by the selective atom deposition method. Therefore, the optical coupling efficiency enhancing layer 30 may not be formed on the hydrophobic layer 20, and the optical coupling efficiency enhancing layer 30 may be formed only on the adjacent between the hydrophobic layer 20.

Specifically, the light emitting side surface may be divided into light emitting regions arranged periodically and spaced, and non-light emitting regions located between the light emitting regions. The optical coupling efficiency enhancement layer 30 may cover the light emitting region, and the hydrophobic layer 20 may be disposed in the non-light emitting region. The optical coupling efficiency enhancement layer 30 may constitute a periodic distribution array, thereby improving the optical coupling efficiency of the OLED device 100.

At the same time, the ink jet printing method and the selective atomic precipitation method used in the above preparation processes may be the method used in the fabricating other devices or other functional layers of the OLED device 100, which may have a simple manufacturing process, and a low cost. The method in the present disclosure may do not require the use of chemical reagents, and do not damage the OLED device 100.

Figure 3:
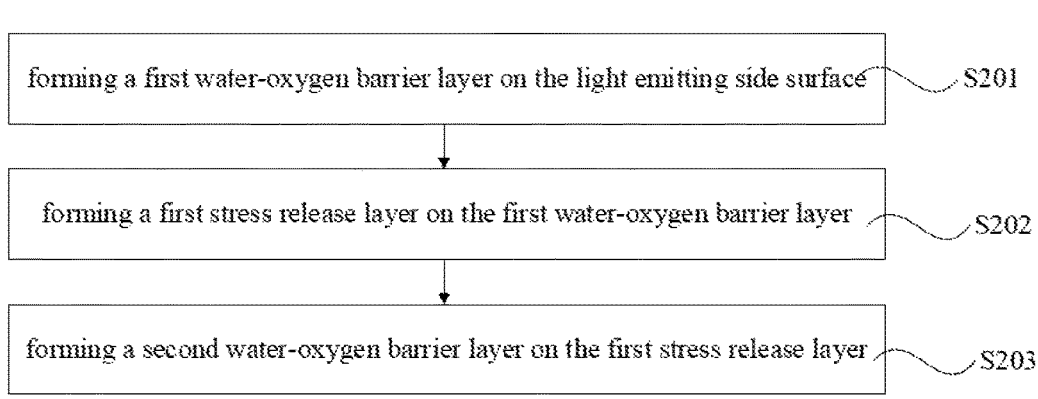
FIG. 3 is a flowchart of a fabricating method according to another embodiment of the present disclosure.

Please referring to FIG. 3, it is a flowchart of a fabricating method according to another embodiment of the present disclosure. The difference between this embodiment and the above embodiment is that the method may further include the following blocks before block S102 described above:

S201: forming a first water-oxygen barrier layer 11 on a light emitting side surface.

The first water-oxygen barrier layer 11 may be formed by any one of the methods such as selective atom precipitation, plasma-enhanced chemical vapor deposition, pulsed laser precipitation, or sputtering method. The first water-oxygen barrier layer 11 may block moisture and air entering the OLED 16, which may ensure the luminescence performance of OLED 16. In some embodiments, the first water-oxygen barrier layer 11 may be an inorganic layer. In some embodiments, the fabrication material may include at least one of SiNx, SiCNx, Al2O3, and SiOx. Referring to FIG. 2, the recesses and projections corresponding to the first water-oxygen barrier layer 11 may be formed. The projections may correspond to the non-light emitting region of the OLED device 100, while the recesses may be the light emitting region of the OLED device 100, wherein both the bottom and the hypotenuse of the recesses may be the light emitting area.

It can be understood that, the optical coupling efficiency enhancement layer 30 may cover at least the light emitting region of the OLED device 100, and the hydrophobic layer 20 may be disposed in the non-light emitting region of the OLED device 100.

In some embodiments, in order to ensure that the light emitting region of the OLED device 100 may be surely covered by the optical coupling efficiency enhancement layer 30, the length of the optical coupling efficiency enhancement layer 30 may be greater than that of the corresponding light emitting region, and the outward extending portion of the optical coupling efficiency enhancement layer 30 may cover the non-light emitting region. In another word, the edge of the optical coupling efficiency enhancement layer 30 may be opposite to the edge of the projections of the first water oxygen barrier layer 11.

S202: forming a first stress release layer 18 on the first water-oxygen barrier layer 11.

The first stress release layer 18 may be formed by plasma enhanced chemical vapor deposition or ink jet printing method. As shown in FIG. 2, the OLED 16 is a periodic variation structure with recesses and projections. The first stress release layer 18 may be mainly a flat surface used to match the shape of the OLED 16. Thus, the hydrophobic layer 20 and the optical coupling efficiency enhancement layer 30 above can be produced on the flat surface, which may ensure the optical coupling efficiency of the OLED device 100. On the other hand, the first stress release layer 18 may enable to buffer the stress when the OLED device 100 may be flexed or folded, which may achieve a flexible display.

In some embodiment, the first stress release layer 18 may be an organic functional layer. In the present embodiment, the first stress release layer 18 may be made of an organic material.

In some embodiments, the production materials may include at least one of styreneacrolein, hexamethyldisiloxane, polyacrylate, polycarbonate, and polystyrene.

S203: forming a second water-oxygen barrier layer 13 on the first stress release layer 18.

The formation process of the second water-oxygen barrier layer 13 and the production materials may be the same as those of the first water-oxygen barrier layer 11, which will not be described here. The second hydrophobic oxygen barrier layer 13 may be used to further block moisture and air from entering the first stress release layer 18.

In some embodiments, the hydrophobic layer 20 and the optical coupling efficiency enhancement layer 30 may be formed on the second water-oxygen barrier layer 13.

Figure 4:
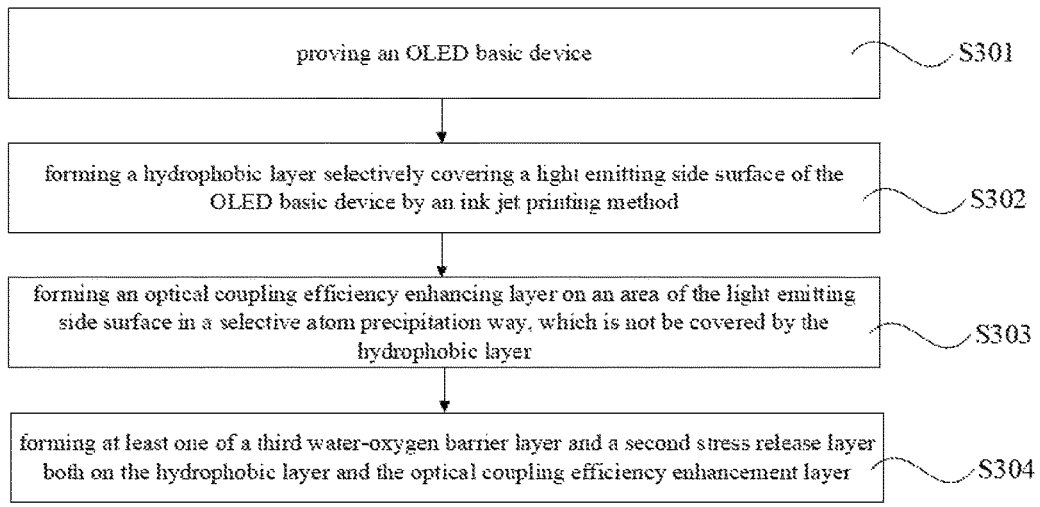
FIG. 4 is a flowchart of a fabricating method according to another embodiment of the present disclosure.

Referring to FIG. 4, which is a flowchart of a fabricating method according to another embodiment of the present disclosure. The difference between this embodiment and the above embodiments is that, after the block S103, the method in this embodiment may further include block S304, and the blocks S301, S302, S303 before block S304 may be respectively corresponding to the blocks S101, S102, S103 in the above embodiments, which may be not repeated here.

S304: forming at least one of a third water-oxygen barrier layer 15 and a second stress release layer (not shown in drawings) on the hydrophobic layer 20 and the optical coupling efficiency enhancement layer 30. The fabricating process and material of the third water-oxygen barrier layer 15 may be the same as those of the first water-oxygen barrier layer 11, and the fabricating process and materials of the second stress release layer are the same as those of the first stress release layer 18, which will not be repeated here.

The third water-oxygen barrier layer 15 formed on the hydrophobic layer 20 and the optical coupling efficiency enhancement layer 30 can block moisture and air entering the optical coupling efficiency enhancement layer 30, preventing moisture and air from corroding the photo-coupling rate enhancing layer 30. The optical coupling efficiency of the OLED device 100 may be guaranteed. The second stress release layer formed on the hydrophobic layer 20 and the optical coupling efficiency enhancement layer 30 can further enhance the flexibility of the OLED device 100.

Figure 5:
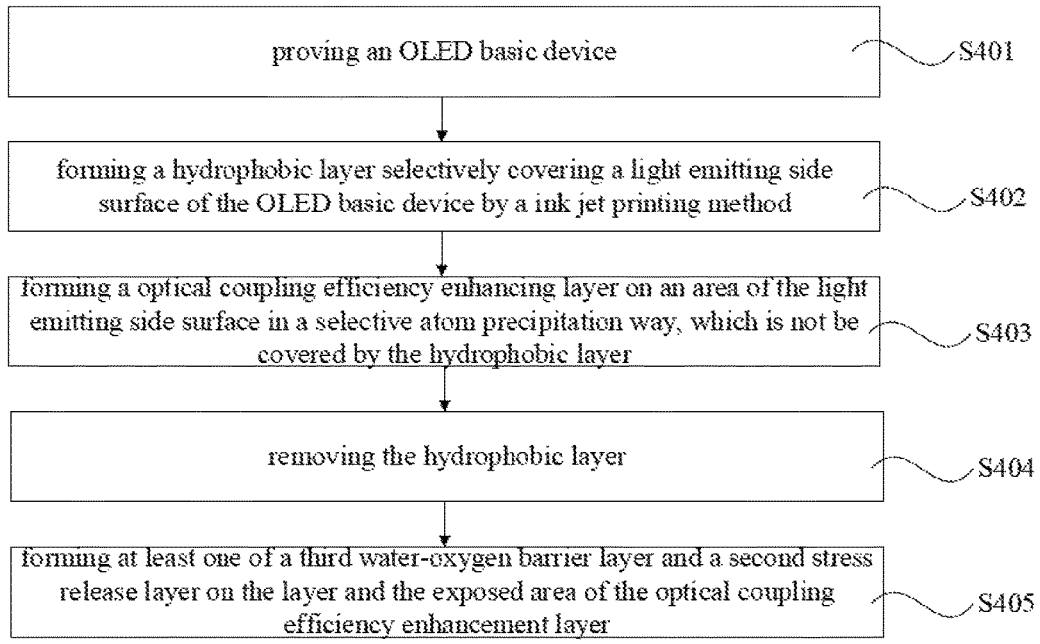
FIG. 5 is a flowchart of a fabricating method according to another embodiment of the present disclosure.

Referring to FIG. 5, which is a flowchart of a fabricating method according to another embodiment of the present disclosure. The main difference between this embodiment and the above embodiments is that, before block S304, the method in this embodiment may further include block S404, and the blocks S401, S402, and S403 before S404 may be respectively corresponding to the blocks S301, S302, S303 in the above embodiments, which may be not repeated here.

S404: removing the hydrophobic layer 20. Specifically, the purpose of preparing the hydrophobic layer 20 is that, the hydrophobic layer 20 may have an inhibitory effect on the thin film (ie, the optical coupling efficiency enhancement layer 30) grown by the selective atom precipitation method. For this reason, the optical coupling efficiency enhancement layer 20 may be formed as aperiodic distribution only in a region not covered by the hydrophobic layer 20. However, the hydrophobic layer 20 may have some micropores, which may be easy to store moisture. If the hydrophobic layer 20 is retained in the OLED device 100, the dryness of the optical coupling efficiency enhancement layer 30 may be easily affected, and the OLED device 100 may be easily corroded, which may affect the optical coupling efficiency of the OLED device 100. Therefore, removing the hydrophobic layer 20 can better improve the optical coupling efficiency of the OLED device 100.

In the present embodiment, the hydrophobic layer 20 may be removed by means of plasma cleaning. This method is simple to operate and can avoid the use of chemical reagents, thereby further protecting the optical coupling efficiency enhancement layer 30 and other components. In other embodiments, the hydrophobic layer 20 may also be removed by means of laser engraving or organic reagents.

Figure 6:
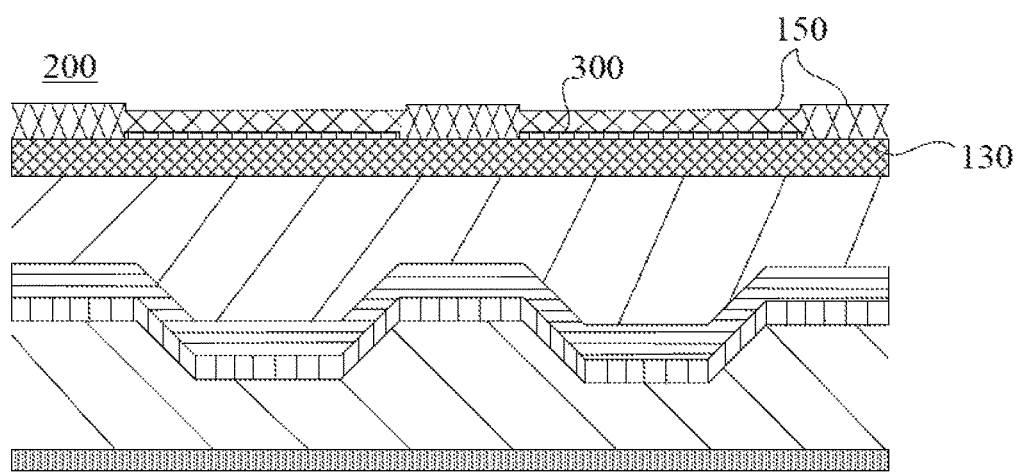
FIG. 6 is a structural schematic view of an OLED device according to another embodiment of the present disclosure.

Referring to FIG. 6, FIG. 6 is a structural schematic view of an OLED device 200 according to another embodiment of the present disclosure. After the block S404 removing the hydrophobic layer, S405 may be further included: forming at least one of a third water-oxygen barrier layer 150 and a second stress release layer (not shown) on the layer and the exposed area of the optical coupling efficiency enhancement layer 300. It can be understood that in other embodiments, block S405 may also be omitted.

The block S405 may be similar to block S304 in the above embodiments except that, at least one of the third water-oxygen barrier layer 150 and the second stress release layer may be formed on the regions of the optical coupling efficiency enhancement layer 300 and the second water-oxygen barrier layer 130, which exposed through the optical coupling efficiency enhancement layer 300.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:
1. A method for fabricating an OLED device, comprising:
providing an OLED basic device; wherein the OLED basic device has a light emitting side surface;
forming a first water-oxygen barrier layer on the light emitting side surface;

forming a first stress release layer on the first water-oxygen barrier layer;

forming a second water-oxygen barrier layer on the first stress release layer;

forming a hydrophobic layer selectively covering a light emitting side surface of the OLED basic device by an ink jet printing manner;

forming an optical coupling efficiency enhancing layer on an area of the light emitting side surface in a selective atom precipitation way, which is not be covered by the hydrophobic layer;

wherein, the light emitting side surface is divided into light emitting regions arranged periodically and spaced, and non-light emitting regions located between the light emitting regions; the optical coupling efficiency enhancement layer covers the light emitting region, and the hydrophobic layer is disposed in the non-light emitting region; the hydrophobic layer and the optical coupling efficiency enhancement layer are formed on the second water-oxygen barrier layer.

2. The method according to claim 1, wherein the hydrophobic layer is made of a polymer material, and the light coupling efficiency enhancing layer is made of metal oxides.

3. The method according to claim 1, after the forming the optical coupling efficiency enhancing layer on the area of the light emitting side surface in the selective atom precipitation way, which is not covered by the hydrophobic layer, further comprising:

forming at least one of a third water-oxygen barrier layer and a second stress release layer both on the hydrophobic layer and the optical coupling efficiency enhancement layer.

4. The method according to claim 3, wherein the first and the second water-oxygen barrier layer are made of an inorganic material, and the first stress release layer is made of an organic material.

5. The method according to claim 1, after the forming the optical coupling efficiency enhancing layer on the area of the light emitting side surface in the selective atom precipitation way, which is not be covered by the hydrophobic layer, further comprising:

removing the hydrophobic layer.

6. The method according to claim 5, after the removing the hydrophobic layer, further comprising: forming at least one of a third water-oxygen barrier layer and a second stress release layer on the layer and the exposed area of the optical coupling efficiency enhancement layer.

7. The method according to claim 5, wherein the removing the hydrophobic layer comprises:

removing the hydrophobic layer by means of one of plasma, cleaning and laser engraving.

8. The method according to claim 1, wherein a thickness of the hydrophobic layer is greater than that of the light coupling efficiency enhancement layer.

9. A method for fabricating an OLED device, comprising:
providing an OLED basic device; wherein the OLED basic device has a light emitting side surface;

forming a hydrophobic layer selectively covering a light emitting side surface of the OLED basic device by an ink jet printing manner;

forming an optical coupling efficiency enhancing layer on an area of the light emitting side surface in a selective atom precipitation way, which is not covered by the hydrophobic layer.

10. The method according to claim 9, wherein the hydrophobic layer is made of a polymer material, and the light coupling efficiency enhancing layer is made of metal oxides.

11. The method according to claim 9, wherein the light emitting side surface is divided into light emitting regions arranged periodically and spaced, and non-light emitting regions located between the light emitting regions; the optical coupling efficiency enhancement layer covers the light emitting region, and the hydrophobic layer is disposed in the non-light emitting region.

12. The method according to claim 9, before the forming the hydrophobic layer selectively covering the light emitting side surface of the OLED basic device by the ink jet printing manner, further comprising:

forming a first water-oxygen barrier layer on the light emitting side surface;

forming a first stress release layer on the first water-oxygen barrier layer;

forming a forming a second water-oxygen barrier layer on the first stress release layer; wherein the hydrophobic layer and the optical coupling efficiency enhancement layer are formed on the second water-oxygen barrier layer.

13. The method according to claim 12, wherein the first and the second water-oxygen barrier layer are made of an inorganic material, and the first stress release layer is made of an organic material.

14. The method according to claim 9, after the forming the optical coupling efficiency enhancing layer on the area of the light emitting side surface in the selective atom precipitation way, which is not covered by the hydrophobic layer, further comprising:

forming at least one of a third water-oxygen barrier layer and a second stress release layer both on the hydrophobic layer and the optical coupling efficiency enhancement layer.

15. The method according to claim 9, after the forming the optical coupling efficiency enhancing layer on the area of the light emitting side surface in the selective atom precipitation way, which is not covered by the hydrophobic layer, further comprising:

removing the hydrophobic layer.

16. The method to claim 15, after the removing the hydrophobic layer, further comprising: forming at least one of a third water-oxygen barrier layer and a second stress release layer on the layer and the exposed area of the optical coupling efficiency enhancement layer.

17. The method according to claim 15, wherein the removing the hydrophobic layer comprises:

removing the hydrophobic layer by means of one of plasma cleaning and laser engraving.

18. The method according to claim 12, wherein a thickness of the hydrophobic layer is greater than that of the light coupling efficiency enhancement layer.

* * * * *